US009353625B2

(12) United States Patent
Luttermann et al.

(10) Patent No.: US 9,353,625 B2

(45) Date of Patent: May 31, 2016

(54) DEVICE FOR CLEANING OXIDIZED OR CORRODED COMPONENTS IN THE PRESENCE OF A HALOGENOUS GAS MIXTURE

(75) Inventors: Ansgar Luttermann, Baden (CH); Alexander Stankowski, Siggenthal-Station (CH); Karsten Bindernagel, Waldshut-Tiengen (CH)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 2025 days.

(21) Appl. No.: 12/352,641

(22) Filed: Jan. 13, 2009

(65) Prior Publication Data

US 2010/0175724 A1 Jul. 15, 2010

(51) Int. Cl.

| | |
|---|---|
| ***C23C 16/00*** | (2006.01) |
| ***C23F 1/00*** | (2006.01) |
| ***H01L 21/306*** | (2006.01) |
| ***F01D 5/00*** | (2006.01) |
| ***C23G 5/00*** | (2006.01) |

(52) U.S. Cl.

CPC *F01D 5/005* (2013.01); *C23G 5/00* (2013.01); *F05D 2230/11* (2013.01)

(58) Field of Classification Search

USPC .......................... 156/345.33, 345.34; 118/715

See application file for complete search history.

(56) References Cited

U.S. PATENT DOCUMENTS

| | | | | | |
|---|---|---|---|---|---|
| 4,482,425 | A | * | 11/1984 | Battey | 216/90 |
| 4,698,130 | A | * | 10/1987 | Restall et al. | 216/62 |
| 4,900,525 | A | * | 2/1990 | D'Angelo et al. | 117/205 |
| 5,643,394 | A | * | 7/1997 | Maydan et al. | 156/345.33 |
| 6,143,361 | A | * | 11/2000 | Near et al. | 427/248.1 |
| 6,164,295 | A | * | 12/2000 | Ui et al. | 134/1.1 |
| 6,416,589 | B1 | | 7/2002 | Lipkin et al. | |
| 6,536,135 | B2 | * | 3/2003 | Lipkin et al. | 34/380 |
| 7,644,512 | B1 | * | 1/2010 | Liu et al. | 34/413 |
| 2004/0050326 | A1 | * | 3/2004 | Thilderkvist et al. | 118/715 |
| 2004/0083972 | A1 | * | 5/2004 | Li et al. | 118/723.001 |
| 2004/0173151 | A1 | * | 9/2004 | Miwa | 118/715 |
| 2005/0000439 | A1 | * | 1/2005 | Warnes et al. | 118/722 |
| 2006/0032444 | A1 | * | 2/2006 | Hara | 118/715 |

(Continued)

FOREIGN PATENT DOCUMENTS

| | | |
|---|---|---|
| DE | 2810598 | 9/1978 |
| DE | 69730905 | 2/2006 |

(Continued)

OTHER PUBLICATIONS

Search Report for German Patent App. No. 10 2008 043 787.5 (Mar. 6, 2009).

(Continued)

*Primary Examiner* — Rakesh Dhingra

(74) *Attorney, Agent, or Firm* — Buchanan Ingersoll & Rooney PC

(57) ABSTRACT

A device for cleaning oxidized or corroded components (26), especially gas turbine components which are exposed to hot gases, in the presence of a halogenous gas, includes a cleaning retort which is designed in the shape of a boiler or cylinder and into which, indirectly or directly, leads a feed line which is connected via a flow control unit to a gas reservoir which stores the halogenous gas, and in which a device for gas distribution is integrated. The flow control unit has a gas volume control valve (5), a heat exchanger unit (9), and also a gas volume measuring unit (6) in sequence along the throughflow direction of the halogenous gas which flows through the feed line. Furthermore, a gas distribution in the retort directs the halogenous gas directly to the components which are to be cleaned.

20 Claims, 4 Drawing Sheets

(56) References Cited

U.S. PATENT DOCUMENTS

| | | | | |
|---|---|---|---|---|
| 2006/0070573 | A1* | 4/2006 | Gartland et al. | 118/715 |
| 2006/0070575 | A1* | 4/2006 | Yamoto et al. | 118/726 |
| 2006/0219362 | A1* | 10/2006 | Han et al. | 156/345.33 |

FOREIGN PATENT DOCUMENTS

| | | | |
|---|---|---|---|
| DE | 102005051310 | | 5/2007 |
| DE | 102005032685 | | 6/2007 |
| EP | 0209307 | | 7/1986 |
| EP | 1 882 823 | A2 | 1/2008 |
| JP | 2001-003750 | A | 1/2001 |

OTHER PUBLICATIONS

Search Report issued on Jul. 14, 2014, by the European Patent Office in corresponding European Patent Application No. 09175543.9-1362. (6 pages).

* cited by examiner

DEVICE FOR CLEANING OXIDIZED OR CORRODED COMPONENTS IN THE PRESENCE OF A HALOGENOUS GAS MIXTURE

BACKGROUND

1. Field of Endeavor

The invention relates to a device for cleaning oxidized or corroded components in the presence of a halogenous gas mixture, with a cleaning retort into which, indirectly or directly, leads a feed line which is connected via a flow control unit to a gas reservoir which stores the halogenous gas mixture. In particular, these components can be turbine components, especially gas turbine blades, which are exposed to impingement by hot gases.

2. Brief Description of the Related Art

Turbine components for power plants or stationary gas turbine installations, which are indirectly or directly exposed to hot gas flows, such as stator blades or rotor blades, heat accumulating segments or similar components or component groups which delimit the hot gas passage, are subjected to operation-induced material degradations which frequently lead to cracks and to mechanical weakening of the respective components which is associated with them. On account of the high temperature, stresses and pressure stresses which prevail in the hot gas passages, to which the corresponding components, which are mostly manufactured from nickel-based materials, are exposed, complex chemically and thermally stable oxides, as result of external and internal oxidation, are deposited on the surfaces of the components, as operating time increases, within the developing crack openings, and also within the regions inside the base material which lie close to the surface.

With a special process chain, it is the aim to change the components, which are stressed in this way and partly damaged into a condition, which largely corresponds to the condition of a newly manufactured comparable component. In this case, it is one of the steps to carefully clean the component which is to be reworked, i.e., to remove the complex oxide layer which is deposited on the surface of the component, and also to remove cracks which have developed within it, without damaging the material of the component itself in the process.

A corresponding cleaning process for the previously referenced components is described in DE 28 10 598 A1, which components are exposed to a pressurized cleaning atmosphere at temperatures of above 1000° C., in which gaseous active fluoride ions are contained. In the presence of such a cleaning atmosphere, the complex oxide reacts with the fluoride ions, forming a gaseous fluoride, without damaging the component material in the process. Such cleaning processes, which are also generally referred to as FIC (fluoride ion cleaning), are sufficiently well-known and described in many publications. In this connection, EP 0 209 307 B1 may be representatively referred to, from which a respectable overview of the cleaning technologies which are known up to now can be gathered.

The object of completely removing oxide layer portions which have been deposited, especially in crack-induced fissure or fault structures, is largely common to all efforts for improving such FIC processes, particularly as the smallest residual portions of oxidized or corroded surfaces already have long-term effects on subsequent repair measures. For purposes of crack-repair on the respectively cleaned components, a soldering or welding process is typically carried out in such a way that a repair alloy in powder form is accumulated over a cleaned crack and, in the presence of a vacuum and by heat action, is made to melt and finally to flow into the fissure-like crack. In this case, a wetting of the crack wall with liquefied repair alloy is formed. It is plain that corresponding wettings on a component surface which is not afflicted with an oxide layer are not carried out, or carried out to a far lesser extent, as a result of which repair weak spots ultimately result, which is necessary to avoid.

For improving the cleaning result, in the previously cited EP 0 209 307 B1, it is proposed to cyclically vary the pressure within the reactive cleaning atmosphere in order to create in this way a common movement of the reactive gaseous fluoride ions in the region of a component which is to be cleaned for the purpose of an intimately contacting the gaseous reaction agent with the walls of the cracks and cavities within the damaged component.

In DE 10 2005 051 310 A1, it is proposed to periodically purge the reaction chamber, in which a halogenous gas mixture is introduced for purposes of component cleaning, with a non-halogenous gas during the cleaning.

U.S. Pat. No. 6,536,135 B2 describes a FIC process in which an improved oxide cleaning is undertaken by variation of the partial pressures of the cleaning gas mixture by carbon being added as an additional component to the cleaning gas mixture, which consists of hydrogen fluoride (HF) and hydrogen ($H_2$). The carbon is added in the form of different compounds which form a carbonaceous gas during the process.

Furthermore, a typical cleaning retort, which provides a cylindrical housing which can be closed off from the top in a gastight manner and which, in an opened state, can be loaded from the top with components which are to be cleaned, is to be gathered from the publication. The components which are to be cleaned are accommodated on racks, so-called trays, which are provided vertically one above the other and fastened on a central pipe which is arranged centrally in the cleaning retort and through which a carbon-enriched hydrogen fluoride-gas mixture is fed to the cleaning retort. The central pipe which penetrates the retort head in a gastight manner extends vertically inside the cleaning retort downwards into the region of the so-called retort sump, in which the central pipe provides a gas distribution structure which extends essentially over the entire cross section of the cleaning retort, and with discharge openings via which the halogenous cleaning gas mixture is fed into the cleaning retort in a manner in which it rises from the bottom upwards. In doing so, the cleaning gas mixture flows through the entire retort volume from the retort sump in the direction of the retort head on which a corresponding gas outlet opening is provided.

ALSTOM has longstanding practical experience in the field of cleaning gas turbine components of the previously described type, which for operationally induced reasons are contaminated, corroded, oxidized, and degraded, especially using FIC cleaning processes and also the cleaning plants which are required for it. In the longstanding association with a cleaning retort which relates to this, which via a central pipe is fed with a cleaning gas mixture which contains hydrogen fluoride and hydrogen in varying ratios, it has been shown that significant malfunctions in the cleaning process are created as a result of volume fluctuations in the feed of the cleaning gas into the cleaning retort, which, upon exceeding certain proportions, can occasionally lead to the breakdown of the entire cleaning process. More accurate investigations furthermore showed that the feeding of fluctuating hydrogen fluoride gas volumes inside the cleaning retort lead to concentration fluctuations which ultimately result in a reduced cleaning efficiency and in an inaccurately controllable cleaning quality which is associated with it. In particular, in the case of very badly damaged components with a large number of material cracks which furthermore have a wide spectrum with regard to depth, width, and length of the individual cracks, an intended level of cleaning under these circumstances can no longer be ensured. The consequences of an incomplete cleaning of components which are covered with a layer of complex oxides have already been discussed above.

A further disadvantageous and therefore improvement-deficient aspect in the case of the cleaning practices which have been used up to now relates to the construction of the cleaning retort. On the one hand, the inflow of cleaning gas into the cleaning retort by means of the centrally guided central pipe and by means of a distribution structure which is provided in the bottom sump region of the retort, and the positioning and stacking possibilities of the individual components which are to be cleaned on the stacking trays which are provided along the central pipe in a vertical sequence, have already been described in connection with the aforementioned U.S. Pat. No. 6,536,135 B2. On account of such a known construction, the stacking or positioning possibilities for the individual components which are to be cleaned in the cleaning retort are limited. The equally improvement-deficient ratios of flow onto the individual components which are to be cleaned inside the cleaning retort add to this, particularly as it cannot be ruled out that, on account of a mutual masking of specific surface regions on the components which are to be cleaned, only an inadequate impingement with cleaning gas is carried out. Thus, the fact that regions with comparatively poor flow ratios and concentration ratios, up to the point of there being dead water regions, are formed as a result of a cleaning gas feed which is provided exclusively in the retort sump region, as a result of which a smaller gas exchange is initiated, especially in regions of the cracks, is not to be ruled out.

For countering the previously pointed out problems with regard to the improvement of cleaning quality, attempts have been made to increase the cleaning cycle times in order to maintain a longer interaction period between the components which are to be cleaned and the cleaning gas mixture, produced only inconsequential results. Moreover, cleaning processes with an increased HF concentration were carried out. However, these attempts only showed that the set cleaning aims were not focused to a satisfactory degree. Rather, these measures led to a cost increase and also to an increased material attack on the components which are to be cleaned.

SUMMARY

One of numerous aspects of the present invention includes a device for cleaning oxidized or corroded components, especially gas turbine components which are exposed to hot gases, in the presence of a halogenous gas, with a cleaning retort which is in the shape of a boiler, into which, indirectly or directly, leads a feed line which via a flow control unit is connected to a reservoir which stores the halogenous gas, in such a way that on the one hand it is ensured that the problems which are associated with an inadequate or fluctuating cleaning gas feed into the cleaning retort are ameliorated or completely remedied. On the other hand, it is necessary to take measures which ensure that each individual component which is to be cleaned and to be introduced into the cleaning retort is exposed to a preferably direct onflow by the cleaning gas so that, as far as possible, no masking effects nor flow dead spaces can be formed within the gas flow. All the measures which are to be taken, moreover, are to be taken from the point of view of economical considerations and a cleaning of each individual component which is as careful as possible, but effective.

An exemplary device embodying principles of the present invention includes a flow control unit that provides a gas volume control valve, a heat exchanger unit, and also a gas volume measuring unit in sequence along the throughflow direction of the halogenous gas which flows through the feed line.

The exemplary device is based on the knowledge that condensations, which especially occur in the region of throttling points, are formed along the feed line for feed of the halogenous gas. Such condensations lead to erroneous values within the scope of gas volume controlling and can lead right up to the total failure of the volume measuring. The halogenous gas is preferably stored in pressurized bottles. Under storage conditions it is in liquid form. By increasing the temperature the liquid is evaporated and the temperature-dependent vapor pressure of the substance is established. Therefore, overpressure conditions prevail upstream of the gas control unit. The pressure inside the cleaning retort lies typically at the pressure level of 50 torr to 780 torr. Therefore, at least one pressure reducing throttling stage is required along the feed line. With this, the previous condensation problem occurs. As a throttling point along the feed line, an exemplary device includes at least one flow control unit which provides a gas volume control valve which expands the gas. For countering the condensation which is formed in this case, a heating unit, which preferably has a gas heater, is provided in the flow direction, directly following the gas volume control valve, as a result of which the temperature level in this region of the line is raised above the condensation level of the halogenous gas, preferably of HF gas. The gas volume control unit is connected directly to the heat exchanger downstream along the feed line, by which the formation of HF condensate can be efficiently avoided. Erroneous measurements, as well as a complete failure of the flow control unit, can be completely excluded with this, as a result of which, moreover, the service life of the individual components of the flow control unit is also significantly increased. This in turn has a positive effect on the initial costs and operating costs and furthermore improves the availability of such cleaning plants.

Heating of the heat exchanger using extremely varied heating techniques is basically possible. The use of an electric heater has proved to be especially advantageous. Equally, however, it is also possible to indirectly heat the line section downstream of the gas volume control valve via correspondingly heated heat transfer media or other heat media. For the materials which are used in the heat exchanger unit, which have contact with the halogenous gases, there is the requirement for chemical resistance to the aggressive halogenous gases, preferably to HF gas.

The heat exchanger unit, with regard to its heat yield, is designed or selected in such a way that a temperature level between 22° C. and 75° C., preferably 40° C. to 50° C., and especially preferably 44° C. to 46° C., can be established.

In an advantageous development, a shut-off valve is provided in each case in the feed line upstream and downstream to the flow control unit, and in the case of a possible failure of the flow control unit, can be operated automatically or manually in each case. In order to ensure that the cleaning gas inflow through the feed line itself is still ensured in such a case, a bypass line to the flow control unit is provided along the feed line, and along which a control valve, preferably a hand control valve, is introduced.

Further details of a preferred embodiment are subsequently left to the description with reference to the figures.

In order to ensure that the individual components which are to be cleaned inside the cleaning retort are optimally exposed to onflow by the cleaning gas in the interests of the cleaning process, a device which provides a central pipe which is indirectly or directly connected to the at least one feed line and extends inside the cleaning retort from the retort head to the retort sump and in the region of the retort sump is connected to a first distribution structure which extends radially to the central pipe and has discharge openings for the halogenous gas, is characterized in that the first distribution structure has a support surface for the components which are to be cleaned, and a second distribution structure is provided which is attached on the central pipe at a distance from the first distribution structure. The first distribution structure at the same time forms a support surface, which extends radially to the central pipe, for the components which are to be cleaned, wherein the distribution structures have discharge openings for the halogenous gas which are oriented at least in the direction of the components which are lying upon them.

The new-type gas distribution concept provides the arrangement of preferably a plurality of so-called distribution structures which are arranged one above the other along the central pipe and which are attached on the central pipe either in a self-supporting manner or are combined with suitably designed support structures along the central pipe.

In variance to the previous cleaning gas feed, which is carried out directly from the central pipe radially outwards, or, according to U.S. Pat. No. 6,536,135 B2, in the region of the retort sump, embodiments of gas distribution in accordance with the present invention provide in each case individual gas feeds along the central pipe in the respective regions of the support surfaces, in each case upon which lie the individual components which are to be cleaned. In this way, the decentralized gas distribution in the cleaning retort serves for distributing the process gas as optimally as possible by the cleaning gas being fed to, and guided away from again, each individual component under largely identical conditions. On account of an individual cleaning gas feed in each individual support surface for the components which are to be cleaned, it is ensured that each individual component is exposed directly and in a suitable manner to impingement by cleaning gas. The number and also the arrangement of the discharge openings which are provided in the respective distribution structure, can be basically optionally selected, but preferably taking into consideration shape, size and arrangement of the components which are to be cleaned.

The distribution structures which are attached in each case along the central pipe with axial spacing and which, depending upon design, can be integrated into stable support structures or can be designed in the form of inherently stable plate or tube constructions, are produced from a material which is resistant to the process conditions which prevail in the cleaning retort, IN600 (Inconel 600) being preferable.

Depending upon the cleaning task and also upon the size and number of the components which are to be cleaned, the cleaning retort is to be equipped with a suitable number of distribution structures which are to be arranged in a distributed manner along the central pipe and upon which the components which are to be cleaned are to be placed.

In a preferred embodiment, the individual distribution structures can be introduced in a modular-like manner and taking into consideration the previously described cleaning task. For this purpose, the distribution structures have a central collar with a collar opening for accommodating the central pipe. With the collar, the individual distribution structures can be positioned and fixed along the central pipe. In order to suitably select the distance between two distribution structures which are to be attached along the central pipe, a corresponding number of cylindrical distance sleeves are to be provided, which as spacers are moved along over the central pipe and which, with the collars which are provided with the distribution structures, are fixed along the central pipe at a distance from each other.

The distribution structures which extend in each case radially from the collar can basically be designed or constructed in different ways. Plate-form or grid-form, or tubular designs for the distribution structure have proved to be especially advantageous. In the case of the design of a distribution structure which is assembled from individual pipe sections or pipes, at least one branch line which extends radially from the central pipe is provided, upon which at least one circular pipe, which is radially at a distance from the central pipe, is attached in a manner in which it annularly encompasses the central pipe. The respective discharge openings are applied along the at least one branch pipe and also along the at least one circular pipe and preferably oriented upwards in each case so that the components which lie upon the distribution structure are directly exposed to impingement by the cleaning gas which issues from the discharge openings. For supplying the distribution structures with the cleaning gas, the previously described collars, to which the distribution structure is connected, have gas openings which are oriented radially to the central pipe and through which the cleaning gas, which radially discharges from the central pipe via corresponding gas discharge openings, can reach the respective distribution structures. Details of this can be gathered from the further description with reference to the figures.

In a further embodiment, the respective distribution structures are designed like disks and in each case have an upper and lower disk plate which include an interspace which, moreover, is enclosed in a gastight manner by a disk rim which connects the two disk plates on their circumferential edge in a fluidtight manner. The disk volume which is delimited in this way is fed via an opening which faces the central pipe with the halogenous cleaning gas which can escape from the disk volume at least via discharge openings which are introduced in the upper disk plate. The number, arrangement or alignment, and also the diameter, of the individual discharge openings can basically be variably adjusted within broad ranges. Thus, per distribution structure, for example, between 100 and 10000 holes or discharge openings, each with diameters between 0.1 mm and 5 mm, are provided.

Depending upon the dimensioning of the cleaning retort, and also the dimensioning of the components which are to be cleaned inside the cleaning retort, preferred dimensions for the discharge openings have been proved in practice, which per distribution structure provide 1000 to 5000 discharge openings, each with diameters between 0.5 mm and 2.5 mm.

For purposes of an improved onflow with cleaning gas which is adapted to the shape and size of the components which are to be cleaned in each case, it is necessary to suitably arrange or to distribute the discharge openings with regard to the usually circular support surface in sectors, for example in the form of radially extending lines or radially and circumferentially arranged field patterns in which the discharge openings are arranged in clusters.

In addition to the design of the discharge openings in the form of conventional holes, it is especially advantageous to configure the discharge openings like nozzles so that the individual gas flows which issue from the discharge openings impinge upon the component which is to be cleaned in each case with an optimized flow velocity and also with a predeterminable outflow direction. Flow guiding elements which influence the gas discharge direction per discharge opening serve for this in an especially advantageous way and can already be formed in a suitable manner during the production of the discharge openings, for example within the scope of shape-forming stamping processes.

In a further preferred embodiment variant, the distribution structures provide not only discharge openings for the cleaning gas on the upper side which faces the support surface in order to expose the components which are lying on the respective distribution structures to impingement with cleaning gas, but, furthermore, corresponding discharge openings are also provided on the opposite underside in order to direct some of the cleaning gas which issues via the distribution structure to those components which lie upon the support surface which is located directly beneath it.

Despite the large number of possible design variants for a respective distribution structure, it can still happen in the case of individual components which are to be cleaned that these are not optimally exposed to impingement by the cleaning gas. In order to eliminate this disadvantage, it is expedient to provide additional cover plates, deflection plates or guard plates, the task of which is to correspondingly deflect gas flows inside the cleaning retort. Such optional additional components, which are also referred to as gas guide plates, can preferably be attached between the respective distribution structures, or directly on the components which are to be cleaned, in order to expose specific areas of components to impingement by the cleaning gas in a particular way, or else to screen specific areas against the cleaning gas in order to avoid a direct contact with the cleaning gas.

BRIEF DESCRIPTION OF THE DRAWINGS

The invention is exemplarily described in the following without limitation of the general inventive idea, based on exemplary embodiments with reference to the drawing. In the drawing.

DETAILED DESCRIPTION OF EXEMPLARY EMBODIMENTS

Figure 1:
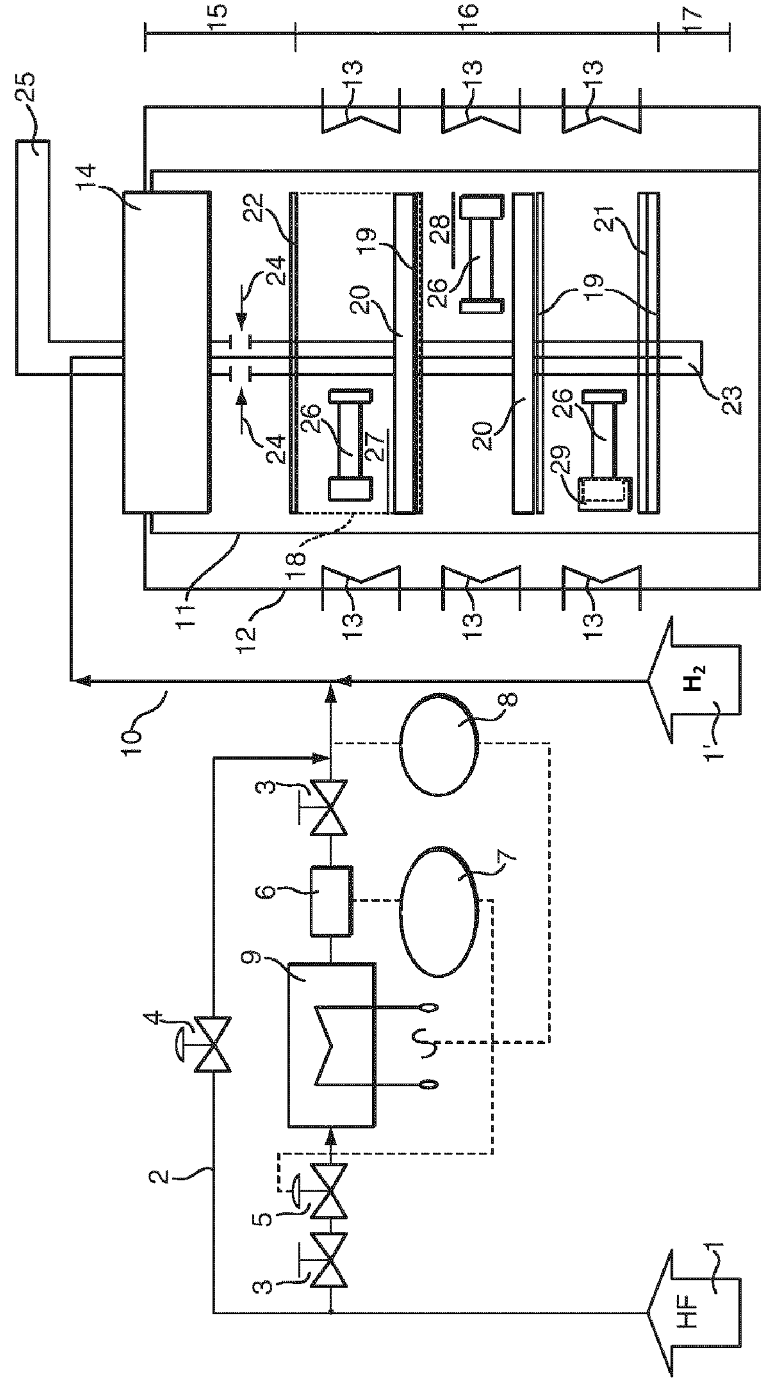
FIG. 1 shows a schematic view of the construction of a cleaning retort embodying principles of the present invention.

FIG. 1 illustrates a schematic construction of a cleaning retort (right-hand half of figure), which is supplied with a cleaning gas mixture via a cleaning gas piping system (left-hand half of figure). The cleaning retort has a retort housing 11 which is designed essentially in the shape of a cylinder or barrel and which on its upper side is closed off in a gastight manner with a retort cover 14. The retort housing 11 is enclosed by a heating jacket 12 in which heating devices 13 ensure a cleaning process temperature in the interior of the cleaning retort of up to 1200° C. A central pipe 23 is provided centrally inside the cleaning retort and outwardly penetrates the retort cover 14 in a gastight manner, and into which cleaning gas is fed via a feed line 10. Moreover, a retort outlet 24 is provided inside the cleaning retort, via which used cleaning gas is carried out via a corresponding exhaust gas pipe 25 for further supply or disposal.

For the provision of cleaning gas, two gas reservoirs 1, 1', specifically a gas reservoir for providing hydrogen fluoride (HF) and a gas reservoir for providing hydrogen gas ($H_2$), are provided in the exemplary embodiment which is shown in FIG. 1. It is necessary to mix the two sorts of gas in a suitable manner with a predetermined mixing ratio before feeding into the feed line 10. For this purpose, a flow control unit is connected along a feed line directly downstream of the HF gas reservoir 1 and includes a gas volume control valve 5, a heat exchanger unit 9 preferably in the form of a gas heater, and also a gas volume measuring unit 6. The heat exchanger unit 9, which is connected directly downstream to the gas volume control valve 5, provides for a marked temperature increase beyond the condensation temperature of the HF gas so that a HF gas supply which is not impaired by any condensation processes can be ensured by means of the flow control unit. A gas temperature control loop 8 serves for the monitoring and controlling of the heat exchanger unit 9. A suitable gas volume control loop 7 is provided for the controlled implementation of the gas volume measuring.

In order to avoid a process breakdown which is associated with the occurrence of a possible failure of the automatic control with regard to the gas temperature and/or to the gas volume, a bypass line 2 is additionally provided, in which a shut-off valve, preferably a hand control valve 4, is mounted. The bypass line 2 is used in that case during which the flow control unit, which includes the gas volume control valve 5, the heat exchanger unit 9, and the gas volume measuring unit 6, is isolated from the gas feed upstream and downstream by two block valves 3. The installed block valves 3 can preferably be designed in the form of valves, cocks, or gates which can be operated both by hand and automatically.

The hand control valve which is provided in the bypass line 2 is preferably designed as a needle-type throughway valve which enables a very finely metered adjustment of the HF gas flow.

The HF cleaning gas mixture which is fed along the feed line 10 into the central pipe 23 discharges inside the process chamber 16 of the cleaning retort via distribution structures 20 which are attached in different planes along the central pipe 23 and upon which lie the components 26 which are to be cleaned in each case. In the exemplary embodiment which is shown, the distribution structures 20 which are provided in the process chamber 16 are constructed separately from support structures 19 which likewise are attached radially on the central pipe 23 and upon which the distribution structures 20 are supported. Via the central pipe 23, the cleaning gas reaches each of the distribution structures 20, from which it discharges in a directed manner directly onto the components 26 which are to be cleaned. Additional gas guide plates 27, 28, and 29, which are provided inside the process chamber 16, ensure exposure of the individual components 26 which are to be cleaned to an individual onflow with cleaning gas.

The lowermost distribution structure 20, which is integrated into a stable tray support 21 which is preferably fixedly connected to the central pipe 23, is located in the region of the retort sump 17.

In order to protect the region of the retort head 15, especially the retort cover 14, against an excessively intense heat loading, a heat shield 22 is attached on the central pipe 23 in the upper region inside the cleaning retort.

Figure 2:
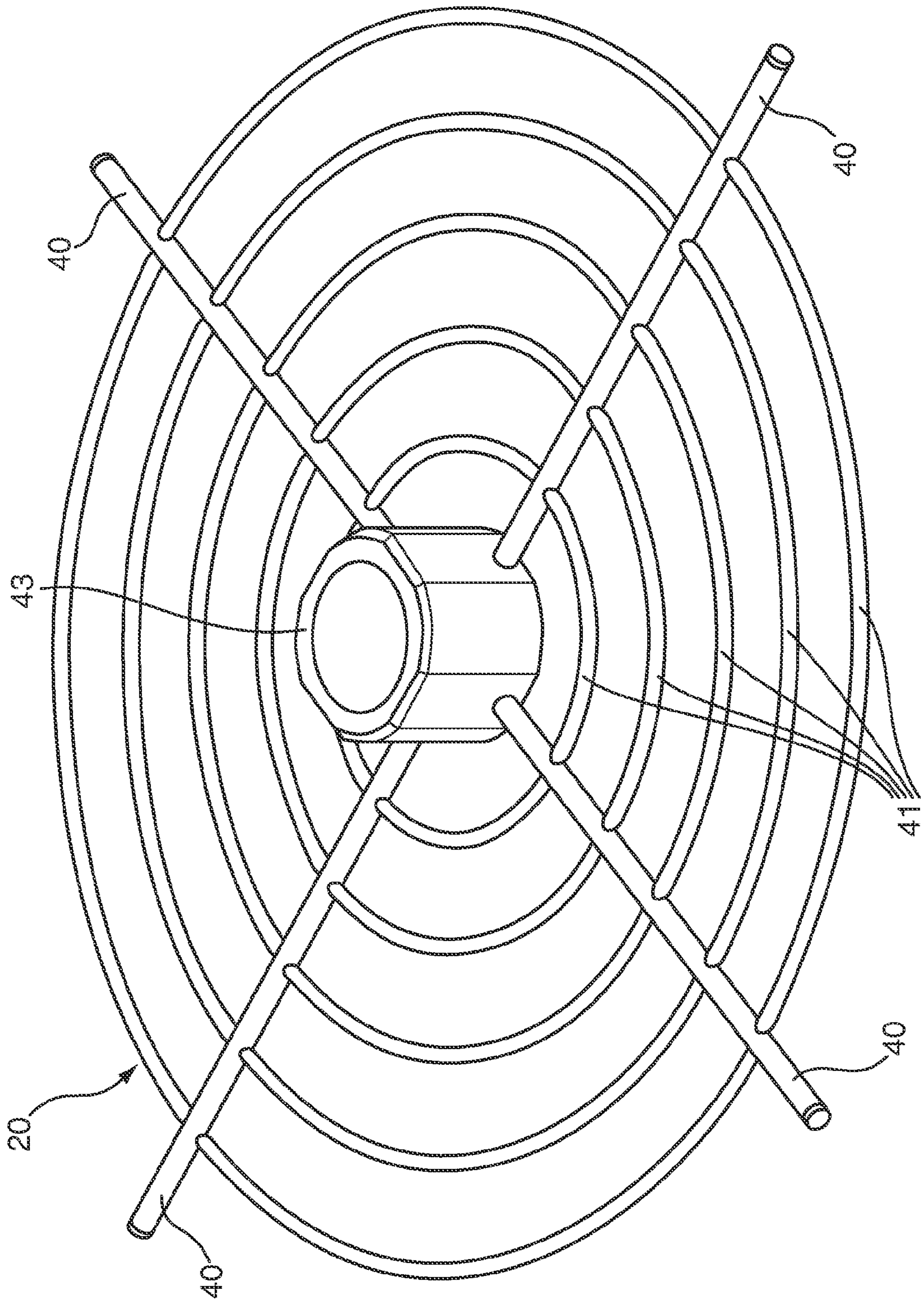
FIG. 2 shows a perspective view of a distribution structure.

In FIG. 2, a preferred embodiment of a distribution structure 20 is shown in perspective view. The distribution structure 20 has a center collar 43 which can be slid in a force-guided manner over the central pipe, which is not additionally shown. If only for completeness, it should be pointed out that instead of the collar, the distribution structure 20 can also be connected directly to the central pipe 23, wherein in this case the component 43 corresponds to the central pipe.

Four branch pipes 40 which extend radially from the collar 43 are connected to this, and concentric circular pipes 41 are connected in each case to the branch pipes. The branch pipes 40 and also the circular pipes 41 form an intercommunicating piping system which is supplied with cleaning gas from the central pipe 23, which is not shown. For this purpose, the collar 43 has openings (not shown) via which the cleaning gas which is provided from the central pipe 23 can be fed into the distribution system. In the exemplary embodiment which is shown, the distribution structure 20 is designed in an inherently stable and robust manner, as a spider's web-like support surface, and is connected rigidly enough to the collar 43 to absorb both the dead weight of the distribution structure 20 as well as the weight of the components 26 which are to be cleaned which are to be placed on the distribution structure 20.

The discharge openings which are provided along the branch pipes 40 and also along the circular pipes 41 and via which the cleaning gas discharges in the direction of the components which lie upon the distribution structure 20, are not shown in FIG. 2.

Figure 3:
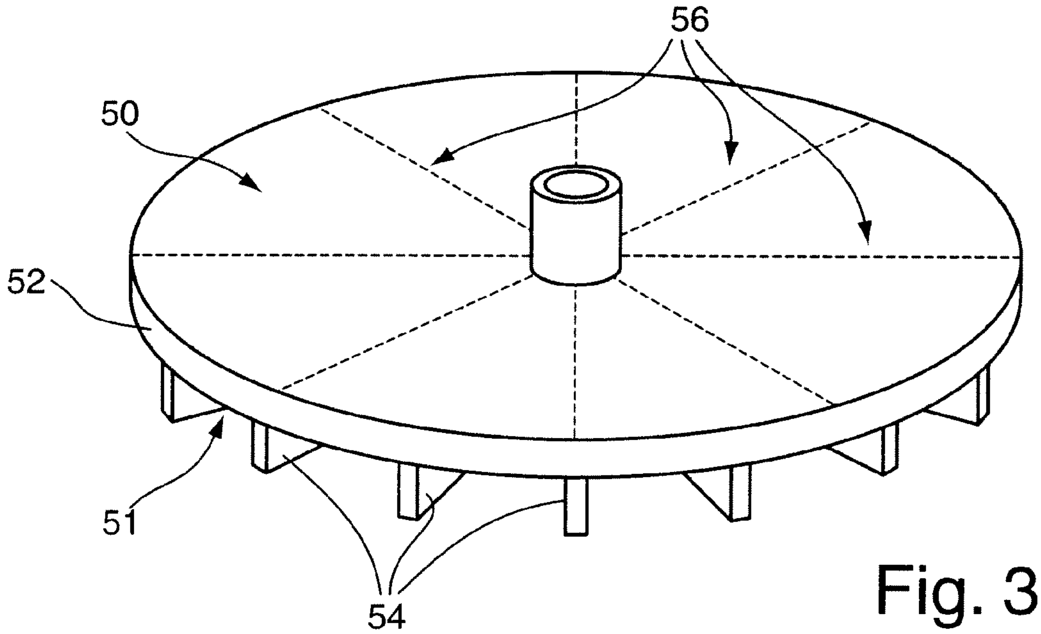
FIG. 3 shows a distribution structure with a plate-form design.

FIG. 3 illustrates, in a highly schematized manner, an alternative exemplary embodiment for a distribution structure which is designed in plate form. The distribution structure in this case has an upper 50 and a lower 51 disk plate, the two plates 50 and 51 being delimited by an encompassing disk rim 52 and including an inner volume. In addition, the distribution structure is connected to a mechanically stable support structure 54. The upper disk plate 50 has sectors which are characterized by boundary lines 55 which, in the embodiment which is shown, each extend radially. The individual sectors can be exchanged in order to adapt the retort as variably as possible to different component types. In the middle, the distribution structure, which is designed in plate form, is penetrated by the central pipe 23 upon which the distribution structure 20 is fixedly attached. Alternatively, the distribution structure is connected to a previously described collar which is threaded over the central pipe 23.

Figure 4:
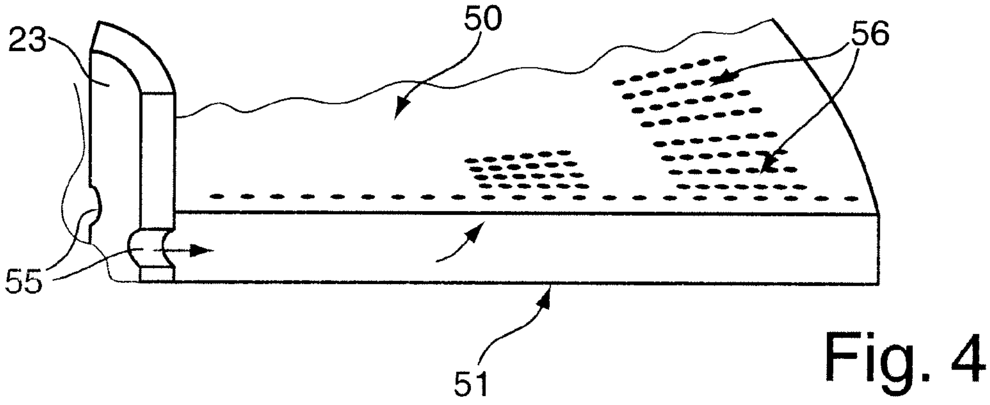
FIG. 4 shows a partially sectioned view of a distribution structure which is designed in plate form.
Figure 5:
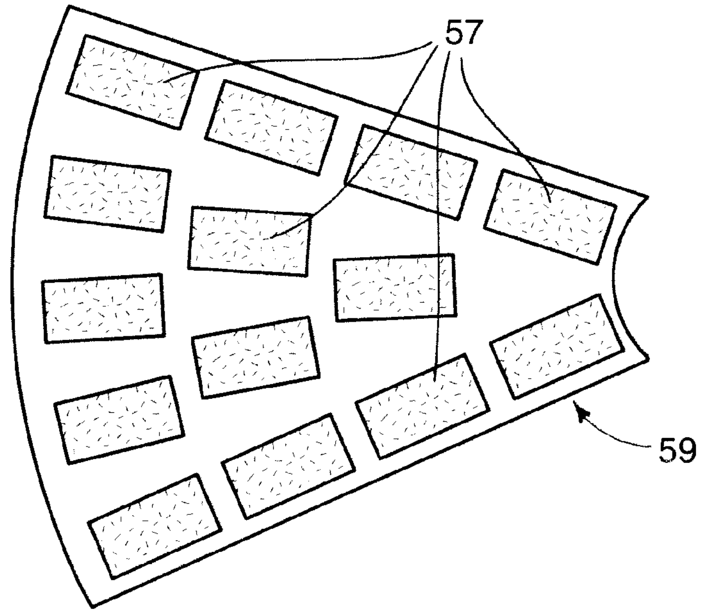
FIG. 5 shows a distribution structure with discharge openings which are arranged in a segmented manner, and also

In FIG. 4, a perspective cross-sectional view through a distribution structure, which is designed in plate form, is shown. In this case, it may be assumed that the upper and the lower disk plates 50, 51 are attached directly on the center central pipe 23. 23 can also be a collar. Via corresponding connecting openings 55, cleaning gas which is fed through the central pipe or collar 23 reaches the interspace between the upper and lower disk plates 50, 51. Via corresponding discharge openings 56 which are incorporated in the upper disk plate 50, the cleaning gas finally discharges into the process chamber. The discharge openings 56 are correspondingly arranged, preferably taking into consideration the components which are to be cleaned which are to be placed on the upper disk plate 50. The exemplary embodiment which is shown in FIG. 4 provides field-like arrangement patterns in sectors for the discharge openings 56. In FIG. 5, the plan view of a segment surface of the upper disk plate 50 is shown, in which a multiplicity of fields 57 are arranged and which in each case includes a multiplicity of individual discharge openings 56. The arrangement and also the number of discharge openings 56 within the individual fields 57 can be selected identically or differently in each case, preferably in dependence upon the components which are to be cleaned in each case.

Figure 6:
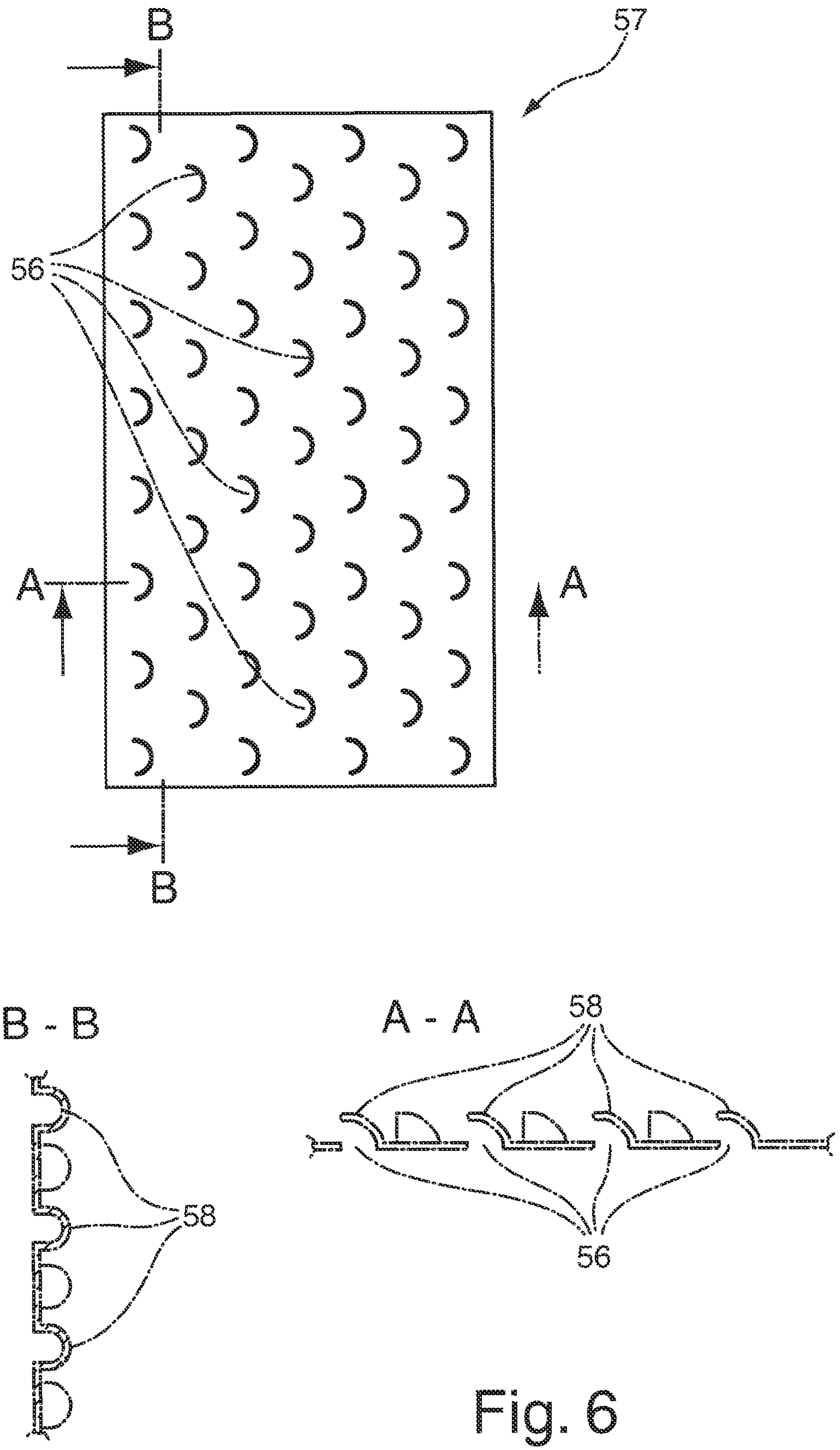
FIG. 6 shows an illustration of discharge openings with flow elements.

FIG. 6 shows in a schematized manner an enlarged view of a field 57 in which a multiplicity of individual discharge openings 56 are provided. The contours of the individual discharge openings are evident with reference to the sectional views A-A and also B-B. In particular, it can be gathered from the sectional view A-A that each individual discharge opening 56 is covered by a flow guiding element 58, as a result of which the discharge flow can impinge upon the respective component in a spatially directed manner.

A number of advantages, with regard to the cleaning of, especially, gas turbine components which are exposed to impingement by hot gas, are associated with the previously described measures with regard to an optimized gas volume control and also to an optimized gas distribution. Thus, on account of the optimized gas volume control a constant gas volumetric flow is formed which can be fed with a small fluctuation range into the cleaning retort. The gas distribution inside the cleaning retort is significantly more homogeneous and more uniform. The individual components can be exposed better and in a defined manner to onflow by the cleaning gas so that a uniform onflow in all surface areas on the components which are to be cleaned can be achieved. In particular, as a result of the measures which are taken no dead spaces occur in which the components which are to be cleaned are more poorly exposed, or not exposed at all, to circumflow or onflow. With a cleaning concept according to the invention a significantly better depth-cleaning, i.e., better oxide removal, of cracks can especially be achieved.

Moreover, the optimized control and gas distribution helps to significantly reduce the volume of HF gas which is to be fed for cleaning purposes. This reduces for one thing the risk of damage to individual components with simultaneously improved cleaning action. For another thing, as a result of this overetched surface areas on the components can be safely avoided. Furthermore, the entire plant is less loaded by the chemically highly-reactive cleaning gas so that the service and operating lives of such plants and their components can be significantly prolonged. In all, the measures help to significantly reduce resources such as the process gases, power and, furthermore, necessary operating systems. Thus, the reduction of cleaning gas automatically leads to the reduction of possible discharge substance flows which are to be disposed of, and therefore to the significant reduction of waste. In all, the operating costs of such plants can be noticeably reduced with the systems and processes embodying principles of the present invention. A higher loading density of the retort, and also a reduction of the process times, also contribute to this.

LIST OF DESIGNATIONS

1 Gas reservoir
2 Bypass line
3 Block valve
4 Hand control line
5 Gas volume control valve
6 Gas volume measuring unit
7 Control loop for gas volume
8 Control loop for gas temperature
9 Heat exchanger unit
10 Feed line
11 Cleaning retort
12 Heating unit
13 Heaters
14 Retort cover
15 Retort head
16 Process chamber
17 Retort sump
18 Retort tray
19 Support structure
20 Distribution structure
21 Support structure-tray support

22 Heat shield
23 Central pipe
24 Retort outlet
25 Exhaust gas pipe
26 Component
27, 28, 29 Gas guiding plates
40 Branch pipe
41 Circular pipe
42 Junction points
43 Collar
50 Upper disk plate
51 Lower disk plate
54 Support structure
55 Connecting opening
56 Discharge openings
57 Field of discharge openings 56
58 Flow guiding element
59 Sector plate While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A device for cleaning oxidized or corroded components in the presence of a halogenous gas mixture, the device comprising:

a cleaning retort;

a feed line for said halogenous gas in fluid communication with said retort;

a flow control unit in fluid communication with the feed line upstream of said retort, the flow control unit configured and arranged to be placed in fluid communication with a gas reservoir which stores the halogenous gas; and wherein the flow control unit includes at least one gas volume control valve, a heat exchanger unit, and a gas volume measuring unit in sequence downstream along the direction of the feed line.

2. The device as claimed in claim 1, further comprising:

shut-off valves in the feed line upstream and downstream of the flow control unit;

a bypass line to the flow control unit along the feed line; and a control valve in the bypass line.

3. The device as claimed in claim 2, wherein the shut-off valves each comprise a block valve.

4. The device as claimed in claim 2, wherein the control valve comprises a hand control valve.

5. The device as claimed in claim 1, wherein the heat exchanger unit comprises an electric heater.

6. The device as claimed in claim 1, further comprising said halogenous gas.

7. The device as claimed in claim 6, wherein the halogenous gas is hydrogen fluoride gas.

8. The device as claimed in claim 1, further comprising:

an inlet line which leads into the retort, wherein the feed line is a first feed line leading into the inlet line upstream of the retort; and at least one second feed line leading into the inlet line upstream of the retort.

9. The device as claimed in claim 8, further comprising:

a hydrogen gas reservoir, the second feed line being connected to the hydrogen gas reservoir.

10. A device for cleaning oxidized or corroded components in the presence of a halogenous gas mixture, the device comprising:

a cleaning retort including a retort head and an internal sump;

a feed line for said halogenous gas in fluid communication with said retort;

a flow control unit in fluid communication with the feed line upstream of said retort, the flow control unit configured and arranged to be placed in fluid communication with a gas reservoir which stores the halogenous gas;

wherein the flow control unit includes at least one gas volume control valve, a heat exchanger unit, and a gas volume measuring unit in sequence downstream along the direction of the feed line;

a central pipe in fluid communication with the feed line, the central pipe extending from the retort head to the retort sump;

a first distribution structure which extends radially from the central pipe and includes discharge openings for the halogenous gas mixture;

wherein the central pipe is connected to the first distribution structure near the retort sump;

wherein the first distribution structure includes a support surface for the components which are to be cleaned, and a second distribution structure arranged on the central pipe at a distance from the first distribution structure and including a support surface which extends radially from the central pipe for the components which are to be cleaned; and wherein the first and second distribution structures include discharge openings for the halogenous gas oriented at least in the direction of, and facing, the components when upon said distribution structures.

11. The device as claimed in claim 10, further comprising:

additional distribution structures arranged along the central pipe each at a distance from each other.

12. The device as claimed in claim 11, wherein the second and additional distribution structures have discharge openings for the halogenous gas which are directed onto a distribution structure which is directly adjacent along the central pipe.

13. The device as claimed in claim 10, wherein the first and additional distribution structures comprise plates or grids.

14. The device as claimed in claim 10, wherein at least one of the distribution structures comprises:

at least one branch pipe which extends radially from the central pipe; and at least one circular pipe which radially extends from the at least one branch pipe at a distance from the central pipe and annularly encompasses said central pipe; and wherein the discharge openings are located along the at least one branch pipe and along the at least one annular circular pipe.

15. The device as claimed in claim 14, wherein:

the at least one branch pipe and the at least one circular pipe are formed of a dimensionally stable tubular material; and the at least one branch pipe and the at least one circular pipe describe a spider's web-like support surface upon which the components which are to be cleaned can be directly placed.

16. The device as claimed in claim 10, wherein the distribution structure encompasses the central pipe and further comprises:

at least one opening for the halogenous gas; and a disk having upper and lower disk plates and a disk rim which connects the upper and lower disk plates in a fluidtight manner on peripheral edges of the disk plates, the disk having a disk volume in fluid communication with the at least one opening; and wherein at least the upper disk plate comprises discharge openings for the halogenous gas.

17. The device as claimed in claim 16, further comprising:

flow guiding elements at the discharge openings configured and arranged to influence the gas discharge direction.

18. The device as claimed in claim 16, further comprising:

modular sector plates;

wherein the upper disk plate comprises recesses into which said sector plates can be inserted; and wherein the sector plates individually comprise predetermined patterns at the discharge openings.

19. The device as claimed in claim 10, further comprising:

a radially inner collar connected to the distribution structure, the inner collar serving as a bearing and support structure; and wherein the inner collar has an opening accommodating the central pipe and along which the inner collar can be forcedly fixed.

20. The device as claimed in claim 19, further comprising:

a plurality of cylindrical distance sleeves along the central pipe positioned between and spacing apart at least two of said distribution structures.

* * * * *